US008136054B2

(12) United States Patent
Chen et al.

(10) Patent No.: US 8,136,054 B2
(45) Date of Patent: Mar. 13, 2012

(54) COMPACT ABBE'S KERNEL GENERATION USING PRINCIPAL COMPONENT ANALYSIS

(75) Inventors: Charlie Chung-ping Chen, Taipei (TW); Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 536 days.

(21) Appl. No.: 12/362,311

(22) Filed: Jan. 29, 2009

(65) Prior Publication Data

US 2010/0191518 A1 Jul. 29, 2010

(51) Int. Cl.
*G06F 17/50* (2006.01)
(52) U.S. Cl. .......................................................... 716/50
(58) Field of Classification Search .................. 716/50, 716/100
See application file for complete search history.

(56) References Cited

U.S. PATENT DOCUMENTS

| | | | |
|---|---|---|---|
| 6,765,651 B1 | 7/2004 | Fiekowsky | |
| 7,716,627 B1* | 5/2010 | Ungar et al. | 716/54 |
| 7,856,612 B1* | 12/2010 | Ungar et al. | 716/55 |
| 7,921,383 B1* | 4/2011 | Wei | 716/54 |
| 7,921,387 B2* | 4/2011 | Wei | 716/56 |
| 2008/0186468 A1 | 8/2008 | Hansen | |
| 2010/0141925 A1* | 6/2010 | Cao et al. | 355/77 |
| 2010/0175042 A1* | 7/2010 | Tirapu Azpiroz et al. | 716/21 |
| 2010/0275178 A1* | 10/2010 | Wei | 716/56 |
| 2011/0145769 A1* | 6/2011 | Wei | 716/56 |

OTHER PUBLICATIONS

Chung Ping Chen, Charlie et al., "Abbe singular-value decomposition: Compact Abbe's kernel generation for microlithography aerial image simulation using singular-value decomposition method", J. Vac. Sci. Technol. B vol. 26, Issue 6, Nov./Dec. 2008, pp. 2322-2330.
Kirchauer, Heinrich "4.3.1 Abbe's Method", Institute for Microelectronics, TU Vienna Apr. 17, 1998, Retrieved for the internet, http://www.iue.tuwien.ac.at/phd/kirchauer/node61.html.

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

Some embodiments provide techniques for determining a set of Abbe's kernels which model an optical system of a photolithography process. During operation, the system can receive optical parameters (e.g., numerical aperture, wavelength, etc.) for the photolithography process's optical system. Next, the system can use the optical parameters to determine a point spread function for an Abbe's source. Note that the point spread function for the Abbe's source can be determined either by discretizing the optical system's light source using a set of concentric circles, or by discretizing the optical system's light source in an orthogonal fashion. The system can then determine a correlation matrix from the point spread function. Next, the system can determine the set of Abbe's kernels by performing an eigen decomposition of the correlation matrix using principal component analysis. The system can then use the set of Abbe's kernels to compute image intensity.

20 Claims, 5 Drawing Sheets

COMPACT ABBE'S KERNEL GENERATION USING PRINCIPAL COMPONENT ANALYSIS

BACKGROUND

1. Field

The present invention generally relates to electronic design automation. More specifically, the present invention relates to methods and apparatuses for determining a photolithography process model based on compact Abbe's kernel generation using principal component analysis.

2. Related Art

Rapid advances in computing technology can largely be attributed to improvements in semiconductor manufacturing technologies which have made it possible to integrate tens of millions of devices onto a single chip.

Photolithography, which can delineate patterns by exposing light onto a photoresist-coated wafer, is an important process in industrial integrated circuit (IC) manufacturing. Photolithography process models are commonly used to model photolithography processes. A process model can be used in a number of applications during the design of a semiconductor chip. For example, photolithography process models are commonly used for making corrections to layouts to compensate for undesirable effects of semiconductor manufacturing processes.

It is desirable to reduce the time it takes to generate a photolithography model, to improve the performance of the photolithography process model, and to improve the accuracy of the photolithography model. In general, there is a trade-off between accuracy and performance. Specifically, increasing the accuracy of a process model usually increases the time it takes to generate the process model, and also increases the time it takes to use the process model (e.g., increases the convolution time).

SUMMARY

Some embodiments provide systems and techniques for determining a photolithography process model which is based on a set of Abbe's kernels which model an optical system of a photolithography process.

During operation, the system can receive optical parameters (e.g., numerical aperture, wavelength, etc.) for the photolithography process's optical system. Next, the system can use the optical parameters to determine a point spread function for an Abbe's source. Note that the point spread function for the Abbe's source can be determined either by discretizing the optical system's light source using a set of concentric circles, or by discretizing the optical system's light source in an orthogonal fashion. The system can then determine a correlation matrix from the point spread function. Next, the system can determine the set of Abbe's kernels by performing an eigen decomposition of the correlation matrix using principal component analysis. The system can then use the set of Abbe's kernels to compute image intensity.

Embodiments of the present invention enable very accurate and efficient modeling of optical systems for photolithography processes. Specifically, using principal component analysis allows the system to substantially reduce the number of Abbe's kernels that are required to accurately model the optical system. Once the photolithography process model is determined, it can be used to predict the shapes of the patterns as they are expected to be printed, and it can be used to perform OPC on a mask layout.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
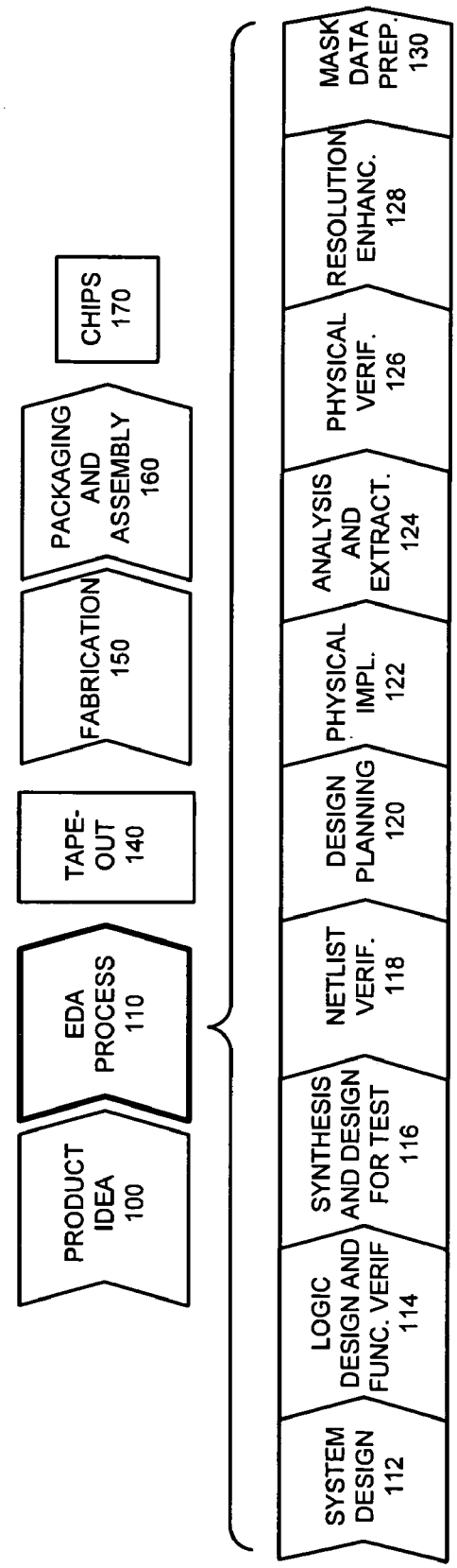
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process can start with a product idea (block 100) which can be realized using an integrated circuit that is designed using an EDA process (block 110). After the integrated circuit is taped-out (event 140), it can undergo a fabrication process (block 150) and a packaging and assembly process (block 160) to produce chips 170.

The EDA flow (block 110) comprises blocks 112-130, which are described below for illustrative purposes only and are not meant to limit the present invention. Specifically, the different sub-processes in the EDA flow may be performed in a different sequence than the sequence described below.

During system design (block 112), circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this stage include Model Architect, Saber®, System Studio, and DesignWare®.

During logic design and functional verification (block 114), the VHDL or Verilog code for modules in the system can be written and the design can be checked for functional accuracy, e.g., the design can be checked to ensure that it produces the correct outputs. Exemplary EDA software products from Synopsys, Inc. that can be used at this stage include VCS®, Vera®, DesignWare®, Magellan™, Formality®, ESP and Leda®.

During synthesis and design for test (block 116), the VHDL/Verilog can be translated to a netlist. Further, the netlist can be optimized for the target technology, and tests can be designed and implemented to check the finished chips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

During netlist verification (block 118), the netlist can be checked for compliance with timing constraints and for correspondence with the VHDL/Verilog source code. Exemplary EDA software products from Synopsys, Inc. that can be used at this stage include Formality®, PrimeTime®, and VCS®.

During design planning (block 120), an overall floorplan for the chip can be constructed and analyzed for timing and top-level routing. Exemplary EDA software products from Synopsys, Inc. that can be used at this stage include Astro™ and IC Compiler products.

During physical implementation (block 122), circuit elements can be positioned in the layout (placement) and can be electrically coupled (routing). Exemplary EDA software products from Synopsys, Inc. that can be used at this stage include Astro™ and IC Compiler products.

During analysis and extraction (block 124), the circuit's functionality can be verified at a transistor level and parasitics can be extracted. Exemplary EDA software products from Synopsys, Inc. that can be used at this stage include Astro-Rail™, PrimeRail, PrimeTime®, and Star-RCXT™.

During physical verification (block 126), the design can be checked to ensure correctness for manufacturing, electrical issues, lithographic issues, and circuitry. Hercules™ is an exemplary EDA software product from Synopsys, Inc. that can be used at this stage.

During resolution enhancement (block 128), geometric manipulations can be performed on the layout to improve manufacturability of the design. Exemplary EDA software products from Synopsys, Inc. that can be used at this stage include Proteus/Progen, ProteusAF, and PSMGen.

During mask data preparation (block 130), the design can be "taped-out" to produce masks which are used during fabrication. Exemplary EDA software products from Synopsys, Inc. that can be used at this stage include the CATS® family of products.

Some embodiments can be used during one or more of the above-described stages. Specifically, some embodiments can be used during physical verification (block 126) or resolution enhancement (block 128).

Overview

Photolithography, which can delineate patterns by exposing light onto a photoresist-coated wafer, is an important component in IC manufacturing. At current wavelengths, optical proximity correction (OPC) is commonly used to perturb and adjust mask patterns to improve image quality. Theoretically, the light intensity on an image plane can be modeled as a convolution between a mask pattern and a set of weighted kernels. Specifically, for coherent illumination, a point spread function can be use a as a kernel to model the light intensity. Note that the point spread function is the Fourier transform of the pupil function, while mutual intensity should also be considered for partially coherent illumination.

In model-based OPC, mask correction is usually performed in several iterations. Starting with the original mask layout, the OPC process can gradually modify the layout in each iteration. Specifically, in each iteration, the OPC process can simulate the effects of the photolithography process by convolving the mask layout with kernels, and compare the simulated pattern with the target pattern to determine if the simulated pattern is within an acceptable tolerance window. If the simulated pattern is not within the acceptable tolerance window, the OPC process can modify the layout accordingly.

Clearly, if the photolithography model is not accurate, the OPC corrections will also not be accurate. Therefore, the accuracy of the photolithography model plays an important role in OPC evaluation. Further, since the OPC correction is performed iteratively, the efficiency of the photolithography model is also important.

Generally, OPC is performed after routing, but it may be beneficial to perform OPC during the routing stage so that the system can avoid routing wires in a manner that would lead to manufacturing problems.

Some embodiments of the present invention generate a compact Abbe's kernel for use in a photolithography process model. Embodiments of the present invention have numerous advantages over conventional techniques for generating kernels. First, since not all of the Abbe's kernels have the same contribution to the aerial image intensity, some of the kernels can be eliminated to make the photolithography model more compact. A compact photolithography model can speed up simulation time, thereby speeding up model-based OPC. Second, with advanced concentric circles source discretization, equivalent kernels with higher precision can be produced. Third, we can use compact Abbe's kernels to build a look-up table to speed up simulation time. Fourth, having compact convolution kernels makes it easier to integrate the photolithography model into routing tools as well.

Image Intensity

In photolithography, the mask pattern is generally illuminated by partially coherent quasi-monochromatic light. The light originates from an incoherent source and reaches the object plane. The mask patterns can be regarded as inputs to the imaging system, and the illumination system as the response mapping from the object plane to the image plane.

Abbe's method (also called source points integration approach) models imaging with such illuminators. This approach is based on a spatial discretization of the source into discrete point sources. The discrete point sources are mutually incoherent due to the thermal nature of the light source. Note that the statistical independence can be of crucial importance for the performance of projection systems, as only a local spatial coherence is introduced on the mask. From a simulation point of view the method can be implemented by determining the intensity of one incident ray at a time, computing its diffraction, and summing up the fields.

The image intensity $I(x, y, z)$ at the point $P(x, y, z)$ on the image plane can be obtained by Hopkins equation, which can then be approximated as shown by the following equation:

$$I(x, y, z) = \int_{-\infty}^{\infty}\int J(f, g) \left| \int_{-\infty}^{\infty}\int H(f+f', g+g') \cdot O(f', g') e^{-i2\pi[(f'-f'')x+(g'-g'')y]} df' dg' \right|^2 df dg. \tag{1}$$

In the above equation, $(f, g)$ and $(f', g')$ are two points, J is the effective light source, and H is the pupil function. $O(f, g)$ is the mask spectrum, and $O(x, y)$ is the mask function.

Equation (1) applies when the source points comprising the light source are mutually incoherent, and hence, the intensities produced by all the source points can be aggregated to obtain the final intensity value. The quantity within the absolute value term in the above equation is the electric field that arises out of a coherent point source of unit strength located at point (f, g). If we denote the square of the absolute value term by $I_{con}$, we can rewrite equation (1) as follows:

$$I(x, y, z) = \int_{-\infty}^{\infty}\int J(f, g) I_{con}(f, g; z) df\, dg, \quad (2)$$

where, $$I_{con}(f, g; z) = \left|\int_{-\infty}^{\infty}\int H(f+f', g+g') \cdot O(f', g') e^{-i2\pi[(f'-f'')x+(g'-g'')y]} df'\, dg'\right|^2. \quad (3)$$

In other words, we can view the overall image as the sum of an infinite number of weighted coherent images, $I_{con}$ with each component image arising from an effective point source of intensity $J(f_s, g_s)$ located at $(f_s, g_s)$.

Beams radiate from the object plane to the image plane by passing through lenses and pupil which could be treated as the transmission function K(x, y). In some embodiments, the function K(x, y) can be expressed in terms of a "jinc" function which is commonly used in optics as follows:

$$K(x, y) = jinc\left(2NA\sqrt{x^2+y^2}\right) \quad (4)$$

$$= \frac{J_1\left(2\pi NA/\lambda\sqrt{x^2+y^2}\right)}{2\pi NA/\lambda\sqrt{x^2+y^2}},$$

where $J_1$ is the Bessel function of the first kind of order one.

Generating Compact Abbe's Kernels Using Singular Value Decomposition

Note that the light intensity I(x, y, z) can be viewed as the output and the mask function O(x, y) as the input passing through the transfer function K. Hence, we can rewrite equation (2) as follows (note that in the asterisk symbol is the convolution operator):

$$I(x, y, z) = \int_{-\infty}^{\infty}\int J(f, g) I_{con}(x, y; z) df\, dg, \quad (5)$$

where, $$I_{con}(x, y; z) = \left|H(x, y)e^{-i2\pi[(f'-f'')x+(g'-g'')y]} * O(x, y)\right|^2. \quad (6)$$

To compute intensity I(x, y, z), we can approximate the effective source function J by using a finite number of point sources as follows:

$$J(f, g) \cong J_\Delta(f, g) = \sum_s a_s \delta(f-f_s, g-g_s) \quad (7)$$

where, $a_s$ is the effective strength of the discretized point source located at $\delta(f-f_s, g-g_s)$. Now, the aerial image can be obtained by an incoherent superposition of all the contributions as follows:

$$I(x, y, z) \cong \sum_s a_s I_{con}(f_s, g_s; z). \quad (8)$$

The image intensity can be computed using Abbe's method as follows: calculate the object spectrum O(f, g) from O(x, y); approximate the effective source J(f, g) by the discretized source $J_\Delta(f, g)$ as shown in Equation (7); for each discrete source point, compute the component image according to Equation (6); and sum the component images to obtain the image intensity as shown in Equation (8). Note that for an effective source of area $A_s$ and an object of area $A_m$, the computation time of the above-described process scales according to $A_s \cdot A_m$.

In source discretization, source points not located at the origin can be seen as source points at the origin point with an additional shift in distance along some direction. These source points that are not located at the original point cause the pupil function shift in the imaging equations. Using the modulation theorem, shift of the pupil function in the frequency domain by a distance causes multiplication of pupil function in the spatial domain by an exponential term. Note that this exponential term is the basis function corresponding to each point F(u, v) in the Fourier space.

Note that after source discretization, the number of source points determines the number of kernels in image simulation. Further, note that more kernels can result in a higher precision, but also a longer computation time. Hence, in conventional kernel generation techniques, there is a trade-off between the precision of the resulting photolithography process model and the computation time. In other words, in conventional techniques, increasing accuracy comes at the cost of increasing the computation time.

In contrast to conventional techniques, some embodiments of the present invention can substantially reduce the number of kernels that need to be used in the model without sacrificing accuracy, thereby allowing a user to create photolithography process models that are both accurate and efficient. Specifically, some embodiments of the present invention are based in part on the following insight: by rewriting the imaging equation and by using singular value decomposition, the number of kernels can be substantially reduced without sacrificing accuracy.

Equations (5) and (6) can be represented in matrix form as follows:

$$I = a|\text{Kernel} \cdot \text{FBasis} * \text{Object}|^2. \quad (9)$$

In the above equation, Kernel is the Abbe's kernel in spatial domain, and Object is the mask function described previously. FBasis represents the exponential Fourier basis term, and "a" is the effective strength of the discretized point sources.

Rewriting Equation (9), the image intensity can be expressed as:

$$I = [\text{Kernel} \cdot \text{FBasis} * \text{Object}] \cdot a \cdot [\text{Kernel} \cdot \text{FBasis} * \text{Object}]^H \quad (10)$$

$$= [\text{Kernel} \cdot \text{FBasis} * \text{Object}] \cdot a \cdot [\text{FBasis}^H \cdot \text{Kernel}^H * \text{Object}^H]$$

$$= [\text{Object} * \text{Kernel} \cdot \text{FBasis}] \cdot a \cdot [\text{FBasis}^H \cdot \text{Kernel}^H * \text{Object}^H]$$

By denoting Kernel·FBasis·$\sqrt{a}$ by $\hat{H}$ in the above equation, Equation (10) can be rewritten as $I = [\text{Kernel} \cdot \hat{H}] \cdot [\hat{H}^* \text{Object}]^H$. Next, by using singular-value decomposition, the $n^2 \times m$ matrix $\hat{H}$ (where n is the resolution) can be expressed as $\hat{H} = USV^T$, where U and V have orthogonal columns, and S is a diagonal matrix whose elements are the singular values of $\hat{H}$. Substituting back into Equation (10), the image intensity can be expressed as:

$$I = [\text{Object} * USV^T] \cdot [\text{Object} * USV^T]^H \qquad (11)$$
$$= [\text{Object} * U]SV^T \cdot VS^H [\text{Object} * U]^H$$
$$= [\text{Object} * U]SS^H [\text{Object} * U]^H$$
$$= [\text{Object} * US][\text{Object} * US]^H$$
$$= [\text{Object} * US]^2$$

Figure 2:
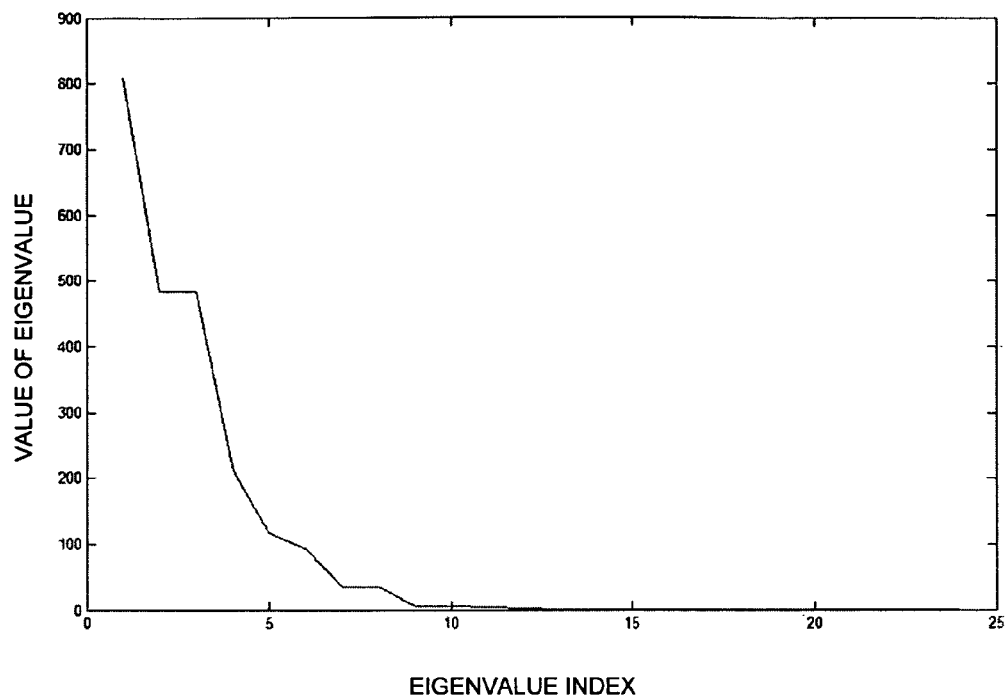
FIG. 2 presents a plot of the eigenvalue distribution obtained in a typical singular value decomposition of $\hat{H}$ in accordance with an embodiment of the present invention.

FIG. 2 presents a plot of the eigenvalue distribution obtained in a typical singular value decomposition of $\hat{H}$ in accordance with an embodiment of the present invention.

Note that the singular of $\hat{H}$ decreases rapidly with the size of the numerical aperture. Some embodiments of the present invention are based in part on the following insight: since the singular of $\hat{H}$ decreases rapidly with the size of the numerical aperture, most of the columns of the U matrix can be ignored, thereby substantially reducing the number of kernels in the model without sacrificing accuracy. Further, note that reducing the number of kernels in the model also reduces the memory required to store the model.

The above technique for reducing the number of kernels can also be used when large NA effects, vector imaging, and the presence of resist are considered. Specifically, as described in A. K. Wong, *Resolution Enhancement Techniques in Optical Lithography*, SPIE Press, 2001, the term $I_{con}$ can be written as:

$$I_{con}(f,g;z) = \left| \int_{-\infty}^{\infty}\int H(f+f',g+g')M(f+f',g+g')E_0 \cdot O(f',g')e^{-i2\pi[(f'-f'')x+(g'-g'')y]}df'dg' \right|^2, \qquad (12)$$

where $M(f+f', g+g')E_0$ accounts for vector transformation and resist stack effect. Using a similar approach as before, $\hat{H}$ can represent the expression Kernel·FBasis·M(f+f', g+g')$E_0 \cdot \sqrt{a}$, and the kernels can be reduced by determining the singular value decomposition for $\hat{H}$.

Note that two source points at locations $(f_s, g_s)$ and $(-f_s, -g_s)$ where both $f_s$ and $g_s$ are positive values will result in the same value of $I_{con}$ in Equation (6). In other words, two source points will have exactly the same contributions to the aerial image by their individual kernel if they have the same distance to the origin point. This insight can be used to discretize the source in concentric circles, instead of the conventional orthogonal discretization.

The new discretization approach cuts the annular light source into many segmented concentric circles. The resulting source points can be put along one line outgoing from the origin point, and their areas can be the product of the panel area and $2\pi r$, where r is the distance of the source point from the origin.

One advantage of using the concentric circle source discretization is the equivalent increase of the kernel number. Assume we produce n kernels along the X-axis, we get the same accuracy as $n^2$ kernels in the orthogonal discretization. Since the change in angle and sigma can be easily bounded, the concentric circle discretization approach can facilitate the determination of source discretization resolution.

Note that the kernel generation approach can be further simplified when used with a mask pattern that has rectangular-shaped slits. The mask function, F(x, y), can be defined as a summation of N two-dimensional slit functions as follows:

$$F(x,y) = \sum_k^N f_k(x,y), \qquad (13)$$

where, each slit $f_k(x, y)$ for Binary Intensity Mask is given by:

$$f_k(x,y) = \begin{cases} 1, & x_{k0} \le x \le x_{k1}, y_{k0} \le y \le y_{k1} \\ 0, & \text{others} \end{cases} \qquad (14)$$

The amplitude $E_k(x, y)$ due to the $k^{th}$ slit $f_k(x, y)$ is given by:

$$E_k(x,y) = \sum_s f_k(x,y) * H(x,y)e^{-i2\pi[(f'-f'')x+(g'-g'')y]}$$
$$= \sum_s \int_{-\infty}^{\infty}\int_{-\infty}^{\infty} H(x-x_1,y-y_1)$$
$$e^{-i2\pi[(f'-f'')(x-x_1)+(g'-g'')(y-y_1)]} f_k(x_1,y_1)dx_1\,dy_1$$

Substituting the upper and lower limit of $f_k(x, y)$ we get:

$$E_k(x,y) = \sum_s \int_{y_{k0}}^{y_{k1}} \int_{x_{k0}}^{x_{k1}} H(x-x_1,y-y_1)e^{-i2\pi[(f'-f'')(x-x_1)+(g'-g'')(y-y_1)]}dx_1\,dy_1$$

After using change-of-variable, the amplitude due to slit $f_k(x, y)$ can be expressed as:

$$E_k(x,y) = \sum_s \int_{y-y_{k0}}^{y-y_{k1}} \int_{x-x_{k0}}^{x-x_{k1}} H(u,v)e^{-i2\pi[(f'-f'')u+(g'-g'')v]}du\,dv \qquad (15)$$

Note that $E_k$ can be easily evaluated directly by integrating the kernel function H and applying suitable upper and lower bounds. Thus, the entire intensity distribution at point (x, y) by the contributions of all slits can be expressed as:

$$I(x,y) = \left| \sum_k^N E_k(x,y) \right|^2 \qquad (16)$$

Generating Compact Abbe's Kernels Using Principal Component Analysis

Some embodiments of the present invention are based in part on the following insight: if we use principal component analysis on the Abbe's kernels, we can construct the correlation matrix analytically, and obtain the eigen decomposition very efficiently.

Recall that Equation (1) describes Abbe's imaging equation. Further, recall that, in Abbe's imaging equation, the effect of applying light source $J(f_0, g_0)$ to H in the frequency domain is equivalent to modulating H in the spatial domain as follows:

$$e^{i2\pi(f_0 x+g_0 y)}H(x,y) \xrightarrow{\mathcal{F}} P(f-f_0, g-g_0)$$

Therefore, Equation (1) can be rewritten in terms of matrix convolution as follows:

$$I=J|H \cdot F * M|^2.$$

In the above equation, M is the mask function in the spatial domain and F is the modulation matrix. The above equation can also be represented as follows (note that, in the equation shown below, H is the equivalent new light source point spread function in the spatial domain):

$$I = [H \cdot F * M] \cdot J \cdot [H \cdot F * M]^T$$
$$= [\hat{H} * M] \cdot J \cdot [\hat{H}^T * M^T].$$

Next, the correlation matrix, C, where $C = \hat{H}^T \cdot \hat{H}$, can be determined. Next, principal component analysis can be used to perform eigen decomposition on $C = V \cdot S \cdot V^T$, where V is the eigenvectors matrix and S is the eigenvalues matrix. Note that matrices V and S can be computed with great efficiency. The new equivalent kernels are $\hat{H} \cdot V$, where the importance of each row depends on the corresponding eigenvalue.

Note that a look-up table approach can be used to quickly compute the result of convolving a rectangular area with a photolithography process model.

Figure 3:
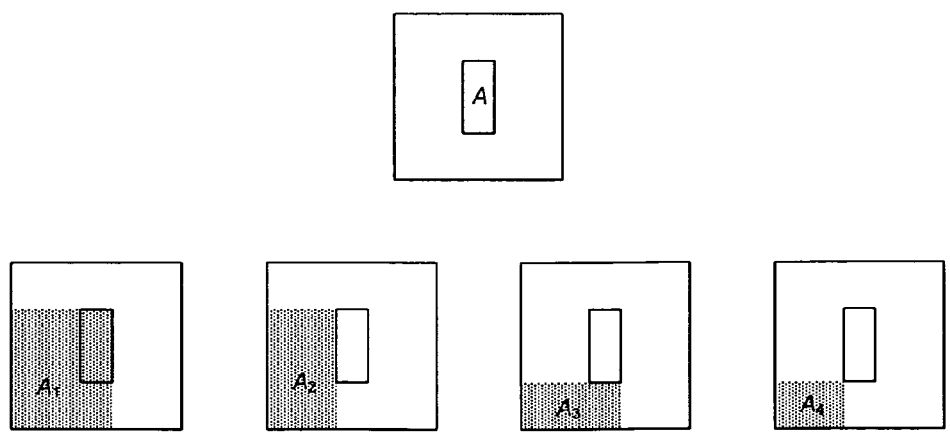
FIG. 3 illustrates how a look-up table can be used to compute the convolution of a rectangular area with a photolithography process model in accordance with an embodiment of the present invention.

FIG. 3 illustrates how a look-up table can be used to compute the convolution of a rectangular area with a photolithography process model in accordance with an embodiment of the present invention.

The convolution of areas $A_1$, $A_2$, $A_3$, and $A_4$ with the photolithography process model can be pre-computed and stored in a look-up table. During run-time, the convolution of area A with the photolithography process model can be computed by looking up the pre-computed convolution values $C_1$, $C_2$, $C_3$, and $C_4$ for areas $A_1$, $A_2$, $A_3$, and $A_4$, respectively. Next, the convolution of area A with the photolithography process model can be computed as $C = C_1 - C_2 - C_3 + C_4$.

Specifically, a mask layout can be decomposed into rectangular areas, and a look-up table can be used to efficiently determine the convolution of each rectangular area with the photolithography process model. The final image intensity value can be determined by summing up the convolution values for all rectangular areas.

Figure 4A:
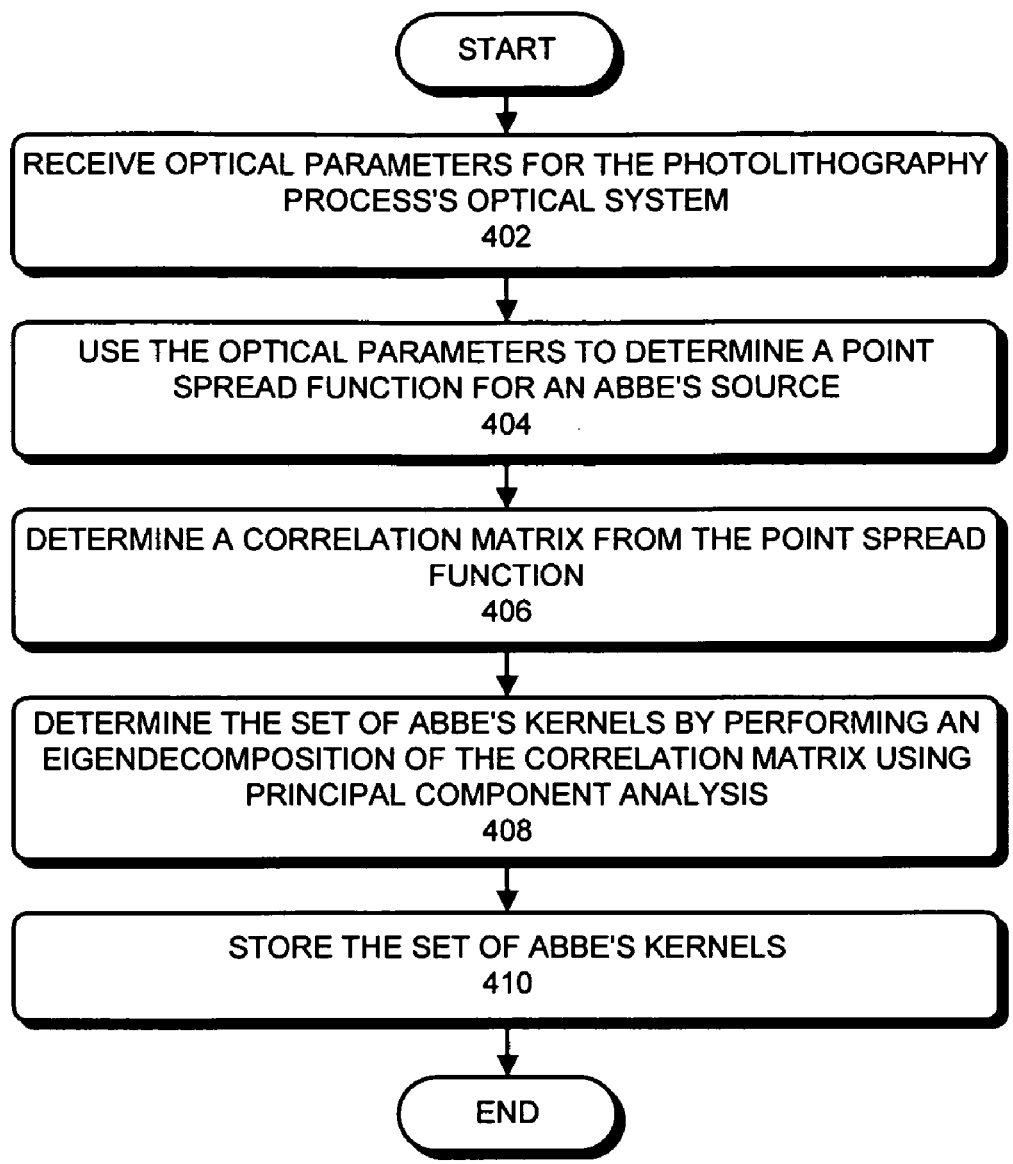
FIG. 4A presents a flow chart which illustrates a process for determining a set of Abbe's kernels in accordance with an embodiment of the present invention.

FIG. 4A presents a flow chart which illustrates a process for determining a set of Abbe's kernels in accordance with an embodiment of the present invention.

The process can begin by receiving optical parameters for the photolithography process's optical system (block 402). For example, the optical parameters can include numerical aperture, wavelength of the light source, coherence, etc.

Next, the system can use the optical parameters to determine a point spread function for an Abbe's source (block 404). In some embodiments, the system can determine the point spread function for the Abbe's source by discretizing the optical system's light source using a set of concentric circles. In other embodiments, the system can determine the point spread function for the Abbe's source by discretizing the optical system's light source in an orthogonal fashion.

The system can then determine a correlation matrix from the point spread function (block 406). Next, the system can determine the set of Abbe's kernels by performing an eigen decomposition of the correlation matrix using principal component analysis (block 408). The system can then store the set of Abbe's kernels (block 410).

Once the set of Abbe's kernels are determined, the system can use them to determine image intensity, to perform OPC, or can use them in a routing tool. Note that although the set of Abbe's kernels enable the system to determine image intensity in a very efficient manner, the system can also generate a look-up table to further increase performance.

Specifically, the system can determine a set of convolution values by convolving the set of Abbe's kernels with a set of areas, and store the set of convolution values in a look-up table. Next, the system can receive a mask layout and decompose the mask layout into a set of polygons. The system can then determine the convolution value for a polygon using the approach illustrated in FIG. 3. Specifically, the system can convolve a polygon with the set of Abbe's kernels by: using the polygon's corners to look up a set of values in the look-up table, and combining the set of values to determine the convolution of the polygon with the set of Abbe's kernels.

Figure 4B:
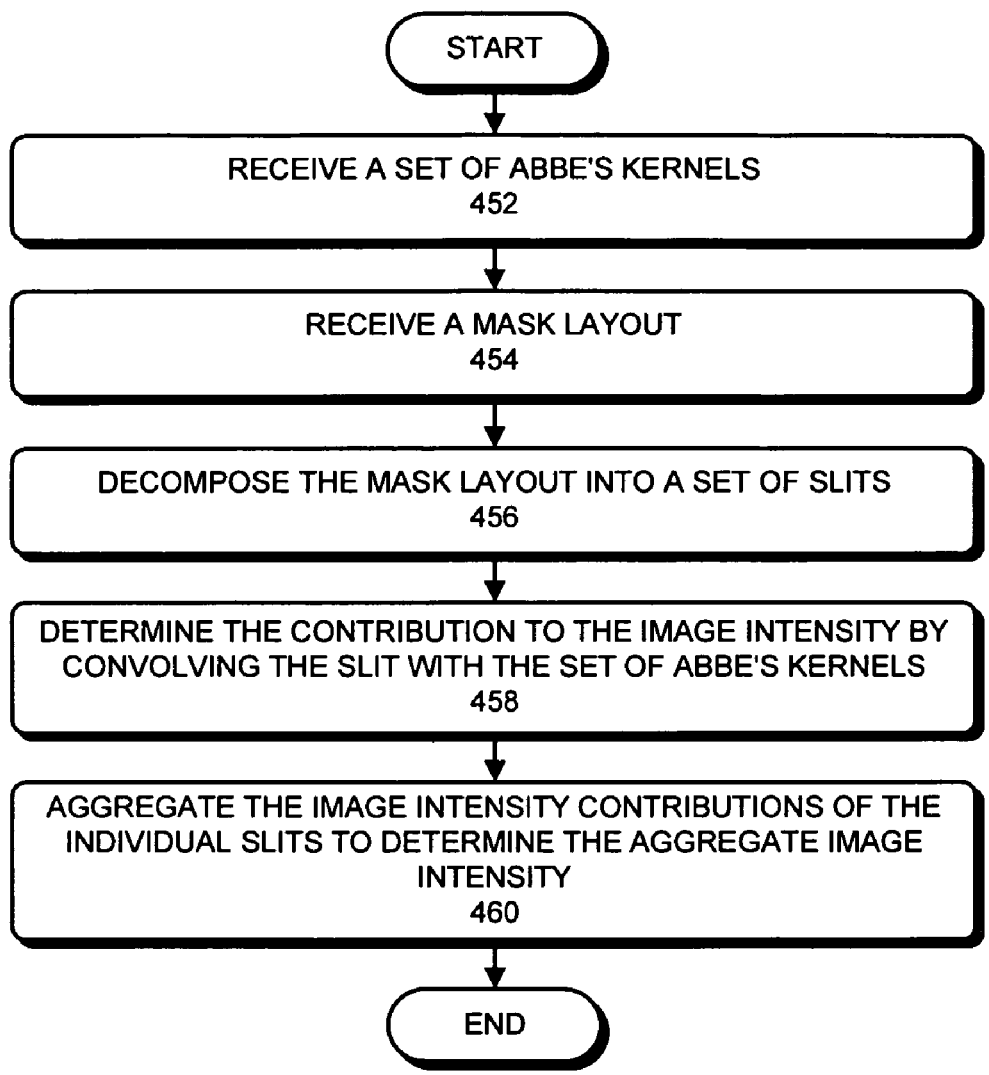
FIG. 4B presents a flow chart which illustrates a process for performing model-based simulation using a set of Abbe's kernels in accordance with an embodiment of the present invention.

FIG. 4B presents a flow chart which illustrates a process for performing model-based simulation using a set of Abbe's kernels in accordance with an embodiment of the present invention.

The process can begin by receiving a set of Abbe's kernels (block 452). Next, the system can receive a mask layout (block 454). The system can then decompose the mask layout into a set of slits (block 456). Next, for each slit, the system can determine the contribution to the image intensity by convolving the slit with the set of Abbe's kernels (block 458). The system can then aggregate the image intensity contributions of the individual slits to determine the aggregate image intensity (block 460).

Figure 5:
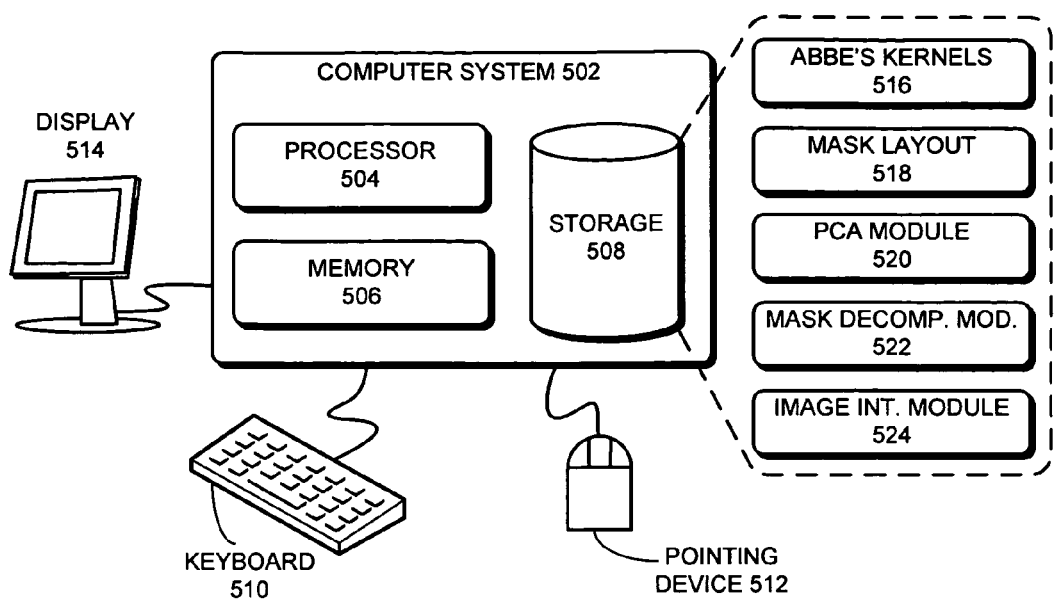
FIG. 5 illustrates a computer system in accordance with an embodiment of the present invention.

FIG. 5 illustrates a computer system in accordance with an embodiment of the present invention.

Computer system 502 comprises processor 504, memory 506, and storage 508. Computer system 502 can be coupled with display 514, keyboard 510, and pointing device 512. Storage 508 can store instructions and/or data that when processed by processor 504 cause computer system 502 to determine a set of Abbe's kernels using principal component analysis. Specifically, storage 508 can store Abbe's kernels 516, mask layout 518, principal component analysis module 520, mask decomposition module 522, and image intensity module 524. During operation, computer system 502 can load instructions and/or data from storage 508 into memory 506 and process the instructions and/or data using processor 504.

Principal component analysis module 520 can include instructions that when executed by processor 504 cause computer system 502 to determine Abbe's kernels 516. Mask decomposition module 522 can include instructions that when executed by processor 504 cause computer system 502 to decompose mask layout 518 into a set of slits. Image intensity module 524 can include instructions that when executed by processor 504 cause computer system 502 to determine the image intensity by using Abbe's kernels 516 and the set of slits generated by mask decomposition module 522.

Figure 6:
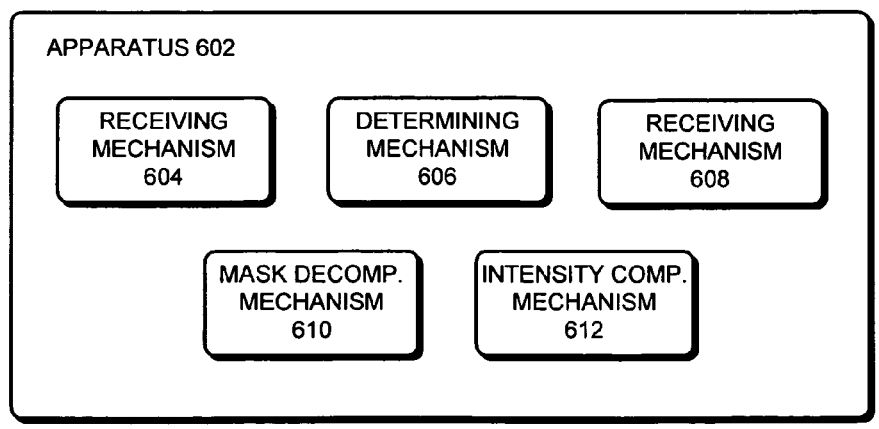
FIG. 6 illustrates an apparatus in accordance with an embodiment of the present invention.

FIG. 6 illustrates an apparatus in accordance with an embodiment of the present invention.

Apparatus 602 can comprise a number of mechanisms which may communicate with one another via a wired or wireless communication channel. Specifically, apparatus 602 can comprise receiving mechanism 604, determining mechanism 606, receiving mechanism 608, mask decomposing mechanism 610, and intensity computing mechanism 612. In some embodiments, receiving mechanism 604 can be configured to receive optical parameters, determining mechanism 606 can be configured to determine a set of Abbe's kernels by performing principal component analysis, receiving mechanism 608 can be configured to receive a mask layout, mask decomposing mechanism 610 can be configured to decompose a mask layout into a set of slits, and intensity computing mechanism 612 can be configured to compute the image intensity by using the set of Abbe's kernels determined by determining mechanism 606, and the set of slits generated by the mask decomposing mechanism 610.

Apparatus 602 can be part of a computer system or be a separate device which is capable of communicating with other computer systems and/or devices. Apparatus 602 may be realized using one or more integrated circuits. Specifically, one or more mechanisms in apparatus 602 can be implemented as part of a processor.

CONCLUSION

The data structures and code described in this detailed description are typically stored on a computer-readable storage device, which may be any device that can store code and/or data for use by a computer system. The computer-readable storage device includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage device as described above. When a computer system reads and executes the code and/or data stored on the computer-readable storage device, the computer system performs the methods and processes embodied as data structures and code and stored within the computer-readable storage device.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a set of kernels which model an optical system of a photolithography process, the method comprising:
   receiving optical parameters for the photolithography process's optical system;
   determining a point spread function for an Abbe's source based on the optical parameters;
   determining a correlation matrix from the point spread function;
   performing, based on principal component analysis, an eigen decomposition of the correlation matrix to obtain the set of kernels; and
   storing the set of kernels.

2. The method of claim 1, further comprising:
   receiving a mask layout;
   decomposing the mask layout into a set of slits; and
   computing an image intensity by:
      convolving each slit in the set of slits with the set of kernels to obtain a set of image intensity contributions; and
      aggregating the image intensity contributions to obtain the image intensity.

3. The method of claim 2, further comprising:
   determining an edge-segment location by comparing the image intensity with a threshold; and
   in response to determining that the edge-segment location is not within a desirable range of a desired location, shifting the edge-segment by a displacement amount.

4. The method of claim 1, further comprising:
   receiving a circuit design; and
   performing routing on the circuit design using a routing tool, wherein the routing tool uses the set of kernels to determine whether a particular route is expected to cause manufacturing problems.

5. The method of claim 1, further comprising:
   determining a set of convolution values by convolving the set of kernels with a set of areas; and
   storing the set of convolution values in a look-up table.

6. The method of claim 5, further comprising:
   receiving a mask layout;
   decomposing the mask layout into a set of polygons; and
   convolving a polygon in the set of polygons with the set of kernels by:
      using the polygon's corners to look up a set of values in the look-up table; and
      combining the set of values to determine the convolution of the polygon with the set of kernels.

7. The method of claim 1, wherein using the optical parameters to determine the point spread function for the Abbe's source involves discretizing the optical system's light source using a set of concentric circles.

8. A computer-readable storage device storing instructions that when executed by a computer cause the computer to perform a method for determining a set of kernels which model an optical system of a photolithography process, the method comprising:
   receiving optical parameters for the photolithography process's optical system;
   determining a point spread function for an Abbe's source based on the optical parameters;
   determining a correlation matrix from the point spread function;
   performing, based on principal component analysis, an eigen decomposition of the correlation matrix to obtain the set of kernels; and
   storing the set of kernels.

9. The computer-readable storage device of claim 8, wherein the method further comprises:
   receiving a mask layout;
   decomposing the mask layout into a set of slits; and
   computing an image intensity by:
      convolving each slit in the set of slits with the set of kernels to obtain a set of image intensity contributions; and
      aggregating the image intensity contributions to obtain the image intensity.

10. The computer-readable storage device of claim 9, wherein the method further comprises:
    determining an edge-segment location by comparing the image intensity with a threshold; and
    in response to determining that the edge-segment location is not within a desirable range of a desired location, shifting the edge-segment by a displacement amount.

11. The computer-readable storage device of claim 8, wherein the method further comprises:
    receiving a circuit design; and
    performing routing on the circuit design using a routing tool, wherein the routing tool uses the set of kernels to determine whether a particular route is expected to cause manufacturing problems.

12. The computer-readable storage device of claim 8, wherein the method further comprises:
  determining a set of convolution values by convolving the set of kernels with a set of areas; and
  storing the set of convolution values in a look-up table.

13. The computer-readable storage device of claim 12, wherein the method further comprises:
  receiving a mask layout;
  decomposing the mask layout into a set of polygons; and
  convolving a polygon in the set of polygons with the set of kernels by:
    using the polygon's corners to look up a set of values in the look-up table; and
    combining the set of values to determine the convolution of the polygon with the set of kernels.

14. The computer-readable storage device of claim 8, wherein using the optical parameters to determine the point spread function for the Abbe's source involves discretizing the optical system's light source using a set of concentric circles.

15. An apparatus for determining a set of kernels which model an optical system of a photolithography process, the apparatus comprising:
  a receiving mechanism configured to receive optical parameters for the photolithography process's optical system;
  a first determining mechanism configured to determine a point spread function for an Abbe's source based on the optical parameters;
  a second determining mechanism configured to determine a correlation matrix from the point spread function;
  a performing mechanism configured to perform, based on principal component analysis, an eigen decomposition of the correlation matrix to obtain the set of kernels; and
  a storing mechanism configured to store the set of kernels.

16. The apparatus of claim 15, further comprising:
  a second receiving mechanism configured to receive a mask layout;
  a decomposing mechanism configured to decompose the mask layout into a set of slits; and
  a computing mechanism configured to compute an image intensity by:
    convolving each slit in the set of slits with the set of kernels to obtain a set of image intensity contributions; and
    aggregating the image intensity contributions to obtain the image intensity.

17. The apparatus of claim 16, further comprising:
  a fourth determining mechanism configured to determine an edge-segment location by comparing the image intensity with a threshold; and
  a shifting mechanism configured to shift the edge-segment by a displacement amount in response to determining that the edge-segment location is not within a desirable range of a desired location.

18. The apparatus of claim 15, further comprising:
  a second receiving mechanism configured to receive a circuit design; and
  a routing mechanism configured to route the circuit design, wherein the routing mechanism uses the set of kernels to determine whether a particular route is expected to cause manufacturing problems.

19. The apparatus of claim 15, further comprising:
  a fourth determining mechanism configured to determine a set of convolution values by convolving the set of kernels with a set of areas; and
  a second storing mechanism configured to store the set of convolution values in a look-up table.

20. The apparatus of claim 19, further comprising:
  a second receiving mechanism configured to receive a mask layout;
  a decomposing mechanism configured to decompose the mask layout into a set of polygons; and
  a convolving mechanism configured to convolve a polygon in the set of polygons with the set of kernels by:
    using the polygon's corners to look up a set of values in the look-up table; and
  combining the set of values to determine the convolution of the polygon with the set of kernels.

* * * * *